United States Patent
Palaniappa

(10) Patent No.: US 6,351,392 B1
(45) Date of Patent: Feb. 26, 2002

(54) OFFSET ARRAY ADAPTER

(75) Inventor: Ilavarasan Palaniappa, Apple Valley, MN (US)

(73) Assignee: Ironwood Electronics, Inc., Eagan, MN (US)

( * ) Notice: Subject to any disclaimer, the term of this patent is extended or adjusted under 35 U.S.C. 154(b) by 0 days.

(21) Appl. No.: 09/412,217

(22) Filed: Oct. 5, 1999

(51) Int. Cl.[7] .......................... H01L 23/48; H01L 23/34; H01L 23/58; H05K 12/16
(52) U.S. Cl. ...................... 361/785; 257/697; 257/723; 257/719; 257/738; 257/780; 257/48; 361/791; 361/790
(58) Field of Search ................... 257/697, 723, 257/719, 738, 737, 780, 48, 679; 361/785, 791, 790

(56) References Cited

U.S. PATENT DOCUMENTS

| | | | |
|---|---|---|---|
| 2,578,288 A | | 12/1951 | Cook |
| 2,951,817 A | * | 9/1960 | Myers |
| 3,229,756 A | * | 1/1966 | Keresztury |
| 3,728,509 A | * | 4/1973 | Shimojo |
| 3,760,342 A | * | 9/1973 | Prouty et al. |
| 3,870,385 A | * | 3/1975 | Avakian et al. |
| 3,971,610 A | * | 7/1976 | Buchoff et al. |
| 4,295,699 A | * | 10/1981 | DuRocher |
| 4,514,784 A | * | 4/1985 | Williams et al. ............ 361/386 |
| 4,550,959 A | * | 11/1985 | Grabbe et al. |
| 4,655,524 A | * | 4/1987 | Etzel |
| 4,668,957 A | * | 5/1987 | Spohr |
| 4,729,166 A | * | 3/1988 | Lee et al. |
| 4,754,546 A | * | 7/1988 | Lee et al. |
| 4,862,076 A | * | 8/1989 | Renner et al. |
| 4,923,739 A | * | 5/1990 | Jin et al. |
| 5,074,799 A | * | 12/1991 | Rowlette, Sr. |
| 5,123,849 A | * | 6/1992 | Deak et al. |
| 5,127,837 A | * | 7/1992 | Shah et al. |
| 5,129,833 A | * | 7/1992 | Rowlette, Sr. |
| 5,137,462 A | * | 8/1992 | Casey et al. .................. 439/74 |

(List continued on next page.)

FOREIGN PATENT DOCUMENTS

| EP | 095826 A2 | * | 3/1999 |
|---|---|---|---|
| EP | 0 905 826 A | | 3/1999 |

OTHER PUBLICATIONS

Ironwood Electronics, Inc. VLSI Interconnection Specialists Catalog XII (pp. 84, 110) (product on p. 110 available at least as early as Oct. 4, 1998).

Primary Examiner—Matthew Smith
Assistant Examiner—James Mitchell
(74) Attorney, Agent, or Firm—Mueting, Raasch & Gebhardt, P.A.

(57) ABSTRACT

The present invention provides a small adapter apparatus useable for high density integrated circuit packages, e.g., ball grid array packages. The adapter apparatus includes an adapter body member having a length along an adapter axis between a first adapter end and a second adapter end of the adapter body member. An array of contact elements, e.g., solder spheres, are disposed on the first adapter end of the adapter body member. Further, the adapter apparatus includes an array of elongated pin elements. Each elongated pin element corresponds to one of the array of contact elements and extends parallel to the adapter axis from a corresponding contact element through the adapter body member and the second adapter end thereof. One or more of the elongated pin elements of the array is of a different length than one or more other elongated pin elements. Various socket devices for receiving and retaining the elongated pins are also provided. For example, a female to male socket device and a female to female socket device are described which utilize offset conductive retaining portions to receive the elongated pin elements of varying length.

26 Claims, 10 Drawing Sheets

U.S. PATENT DOCUMENTS

| | | | |
|---|---|---|---|
| 5,140,405 A | * 8/1992 | King et al. | |
| 5,155,661 A | * 10/1992 | Nagesh et al. | |
| 5,163,837 A | * 11/1992 | Rowlette, Sr. | |
| 5,286,218 A | * 2/1994 | Sakurai et al. | |
| 5,313,099 A | * 5/1994 | Tata et al. | |
| 5,318,456 A | * 6/1994 | Mori | 439/266 |
| 5,340,318 A | * 8/1994 | Kunihiro | |
| 5,377,900 A | * 1/1995 | Bergmann | 228/124.1 |
| 5,387,861 A | * 2/1995 | Neiderhofer | 324/158.1 |
| 5,389,819 A | * 2/1995 | Matsuoka | |
| 5,397,240 A | * 3/1995 | Herard | |
| 5,397,245 A | * 3/1995 | Roebuck et al. | |
| 5,397,919 A | * 3/1995 | Tata et al. | |
| 5,418,471 A | 5/1995 | Kardos | |
| 5,432,679 A | * 7/1995 | Grabbe | |
| 5,445,526 A | * 8/1995 | Hoshino et al. | 439/69 |
| 5,468,158 A | 11/1995 | Roebuck et al. | |
| 5,473,510 A | 12/1995 | Dozier, II | |
| 5,477,160 A | 12/1995 | Love | |
| 5,528,462 A | 6/1996 | Pendse | |
| 5,548,223 A | 8/1996 | Cole et al. | |
| 5,566,052 A | 10/1996 | Hughes | |
| 5,636,996 A | 6/1997 | Johnson et al. | |
| 5,662,163 A | 9/1997 | Mira | |
| 5,667,870 A | 9/1997 | McCullough | |
| 5,691,041 A | 11/1997 | Frankeny et al. | |
| 5,699,227 A | 12/1997 | Kolman et al. | |
| 5,710,459 A | 1/1998 | Teng et al. | |
| 5,712,768 A | 1/1998 | Werther | |
| 5,730,620 A | 3/1998 | Chan et al. | |
| 5,735,698 A | 4/1998 | Bakker et al. | |
| 5,741,141 A | 4/1998 | O'Malley | |
| 5,742,481 A | 4/1998 | Murphy et al. | |
| 5,745,346 A | 4/1998 | Ogawa et al. | |
| 5,766,022 A | 6/1998 | Chapin et al. | |
| 5,770,891 A | 6/1998 | Frankeny et al. | |
| 5,783,461 A | 7/1998 | Hembree | |
| 5,793,618 A | 8/1998 | Chan et al. | |
| 5,805,424 A | 9/1998 | Purinton | |
| 5,810,607 A | 9/1998 | Shih et al. | |
| 5,819,406 A | 10/1998 | Yoshizawa et al. | |
| 5,829,988 A | 11/1998 | McMillan et al. | |
| 5,833,471 A | 11/1998 | Selna | |
| 5,859,538 A | 1/1999 | Self | |
| 5,876,219 A | 3/1999 | Taylor et al. | |
| 5,879,172 A | 3/1999 | McKenna-Olson et al. | |
| 5,892,245 A | * 4/1999 | Hilton | 257/48 |
| 5,893,765 A | 4/1999 | Farnworth | |
| 5,896,037 A | 4/1999 | Kudla et al. | |
| 5,923,176 A | * 7/1999 | Porter | 324/754 |
| 5,982,635 A | * 11/1999 | Menzies et al. | 361/790 |

\* cited by examiner

OFFSET ARRAY ADAPTER

FIELD OF THE INVENTION

The present invention relates to electrical adapters. More particularly, the present invention pertains to electrical adapters for use with packaged devices, e.g., adapters for ball grid array packages.

BACKGROUND OF THE INVENTION

Certain types of integrated circuit packages are becoming increasingly popular due to their occupancy area efficiency. In other words, they occupy less area on a target board on which they are mounted while providing a high density of contact terminals. For example, one such high density package type is a ball grid array package. Generally, ball grid array packages contain an integrated circuit having its die bond pads electrically connected to respective conductive solder spheres that are distributed on the bottom surface of the package in an array. A target printed circuit board typically has formed on its surface a corresponding array of conductive pads which are aligned with the array of solder spheres for electrically mounting the ball grid array package on the target board. The target board typically includes other conductive traces and elements which lead from the array of conductive pads used for mounting the ball grid array package to other circuitry on the board for connecting various components mounted thereon. Typically, to mount such a ball grid array package to a target board, the package is positioned with the array of solder spheres corresponding to the array of conductive pads on the target board. The resulting structure is then heated until the solder sphere is melted and fused to the conductive pads of the target board.

Such area efficient packaging, e.g., ball grid array packages, provide a high density of terminals at a very low cost. Also, this packaging provides for limited lead lengths. The limited lead lengths may reduce the risk of damage to such leads of the package, may provide for higher speed product, etc. Generally, circuit boards and/or components mounted thereon are tested by designers as the circuit boards are being developed. For a designer to test a circuit board which utilizes a ball grid array package, the designer must first electrically connect the solder balls on the ball grid array package to the target board. As described above, this generally includes mounting the ball grid array package on the target board and heating the solder spheres to fuse the solder spheres to the conductive pads of the target board. Therefore, the package may be prevented from being used again. It is desirable for various reasons to reuse ball grid array packages after testing. For example, such ball grid array packages may be relatively expensive. Further, the solder spheres when fused to the conductive pads of the target board are not accessible for testing purposes and also it is difficult to rework the target board with the package soldered thereon.

Various adapters for ball grid array packages which electrically connect a ball grid array package to a target printed circuit board without requiring that the solder balls on the ball grid array package be fused to the target board are known. For example, one such adapter is shown in U.S. Pat. No. 5,892,245 to Hilton, issued Apr. 6, 1999 and entitled "Ball Grid Array Package Emulator." However, the high density of terminals for certain packages, e.g., ball grid array packages, micro ball grid array packages, and chip scale packages, lead to various interconnect problems for adapters being used with such packages. For example, such a high density of terminals, e.g., solder spheres, of such packages may lead to isolation problems between conductive elements of conventional adapters used for connecting the package to the target board. For example, to provide an adapter which is generally of the same size (e.g., same length and width) as the integrated circuit package leaves little room for insulating material between conductive elements of the adaptor used to connect the solder spheres to the target board. Further, for example, accessing the internal electrical signal of the adapter is difficult, it may be difficult to connect a logic analyzer or other test equipment thereto, and it may be difficult to plug a daughter circuit board thereto for various analysis purposes.

SUMMARY OF THE INVENTION

The present invention provides a small adapter apparatus usable for high density integrated circuit packages, e.g., ball grid array packages, micro ball grid array packages, flip chip packages, and chip scale packages. An adapter apparatus according to the present invention includes an adapter body member having a length along an adapter axis between a first adapter end and a second adapter end of the adapter body member. An array of contact elements, e.g., solder spheres, are disposed on the first adapter end of the adapter body member. Further, the adapter apparatus includes an array of elongated pin elements. Each elongated pin element corresponds to one of the array of contact elements and extends parallel to the adapter axis from a corresponding contact element through the adapter body member and the second adapter end thereof. One or more of the elongated pin elements of the array is of a different length than one or more other elongated pin elements.

In one embodiment of the adapter apparatus, the array of elongated pin elements includes at least a first set of elongated pin elements of a first length and a second set of elongated pin elements of a second length. At least one of the elongated pin elements of the first set is positioned between two elongated elements of the second set.

In another embodiment of the adapter apparatus, the array of elongated pin elements includes rows and columns of elongated pin elements. The rows and columns of elongated pin elements are arranged along x and y axes perpendicular to the adapter axis. Further, each elongated pin element is of a different length than elongated pin elements adjacent thereto along the x and y axes.

In yet another embodiment of the adapter apparatus, the apparatus includes a socket device to receive the elongated pin elements. The socket device includes a socket body member having a length along a socket axis between a first body member end and a second body member end thereof. The socket device further includes an array of socket elements arranged in the socket body member generally parallel to the socket axis as a function of the array of elongated pin elements. Each socket element extends at least between the first body member end and the second body member end.

In various embodiments of the socket device, the socket device may be configured as a female-to-male socket device. In other embodiments of the socket device, the socket device may be configured as a female-to-female socket device.

Further, in one embodiment of the socket device, the array of socket elements include at least a first set of socket elements and a second set of socket elements. The first set of socket elements is provided in the socket body member to receive elongated pin elements of the array of elongated pin elements having a first length, and the second set of socket elements is provided in the socket body member to receive elongated pin elements of the array of elongated pin elements having a second length.

Further, in yet another embodiment of the socket device, each of the socket elements of the first set include conductive socket retaining portions to receive and retain the elongated pin elements having a first length and each of the socket elements of the second set include conductive socket retaining portions to receive the elongated pin elements having a second length. The conductive socket retaining portions of the first set are offset along the direction of the socket axis from conductive socket retaining portions of the second set.

In yet another embodiment of the adapter apparatus, the socket device includes a first socket body member portion having a length along a socket axis between a first body member end and a second body member end thereof Further, the socket device includes a second socket body member portion having a length along a socket axis between a first body member end and a second body member end thereof. A first array of socket elements are arranged in the first socket body member portion generally parallel to the socket axis thereof configured to receive elongated pin elements of a first length and a second array of socket elements are arranged in the second socket body member portion generally parallel to the socket axis thereof configured to receive elongated pin elements of a second length. A printed wiring board is positioned between the first and second socket body member portions of the socket device.

Another adapter apparatus according to the present invention includes a socket body member having a length along a socket axis between a first body member end and a second body member end thereof. The adapter apparatus further includes an array of socket elements arranged in the socket body member generally parallel to the socket axis configured to receive an array of elongated pin elements. The array of socket elements include at least a first set of socket elements and a second set of socket elements. Each of the socket elements of the first set include conductive socket retaining portions to receive and retain elongated pin elements having a first length and each of the socket elements of the second set include conductive socket retaining portions to receive and retain the elongated pin elements having a second length. The conductive socket retaining portions of the first set are offset along the direction of the socket axis from the conductive socket retaining portions of the second set.

In one embodiment of the adapter apparatus, the conductive socket retaining portions of the first and second set of the socket elements include socket pin elements extending therefrom. In other words, this provides a female-to-male socket device.

In yet another embodiment of the adapter apparatus, the conductive socket retaining portions of the first and second set of socket elements include back-to-back conductive socket retaining portions open in opposing directions along the socket axis. In other words, this provides a female-to-female socket device.

In various embodiments of the present invention, various portions of the socket elements are adjacent and insulated from other portions thereof. Such insulation provides for minimized cross-talk between conductive portions of the socket elements and pins received in such socket elements.

In yet another embodiment of the adapter apparatus, the array of socket elements include rows and columns of socket elements. The rows and columns of socket elements are arranged along x and y axes perpendicular to the socket axis. Each conductive socket retaining portion is offset along the direction of the socket axis from conductive socket retaining portions adjacent thereto along the x and y axes.

DETAILED DESCRIPTION OF THE EMBODIMENTS

Figure 1A:
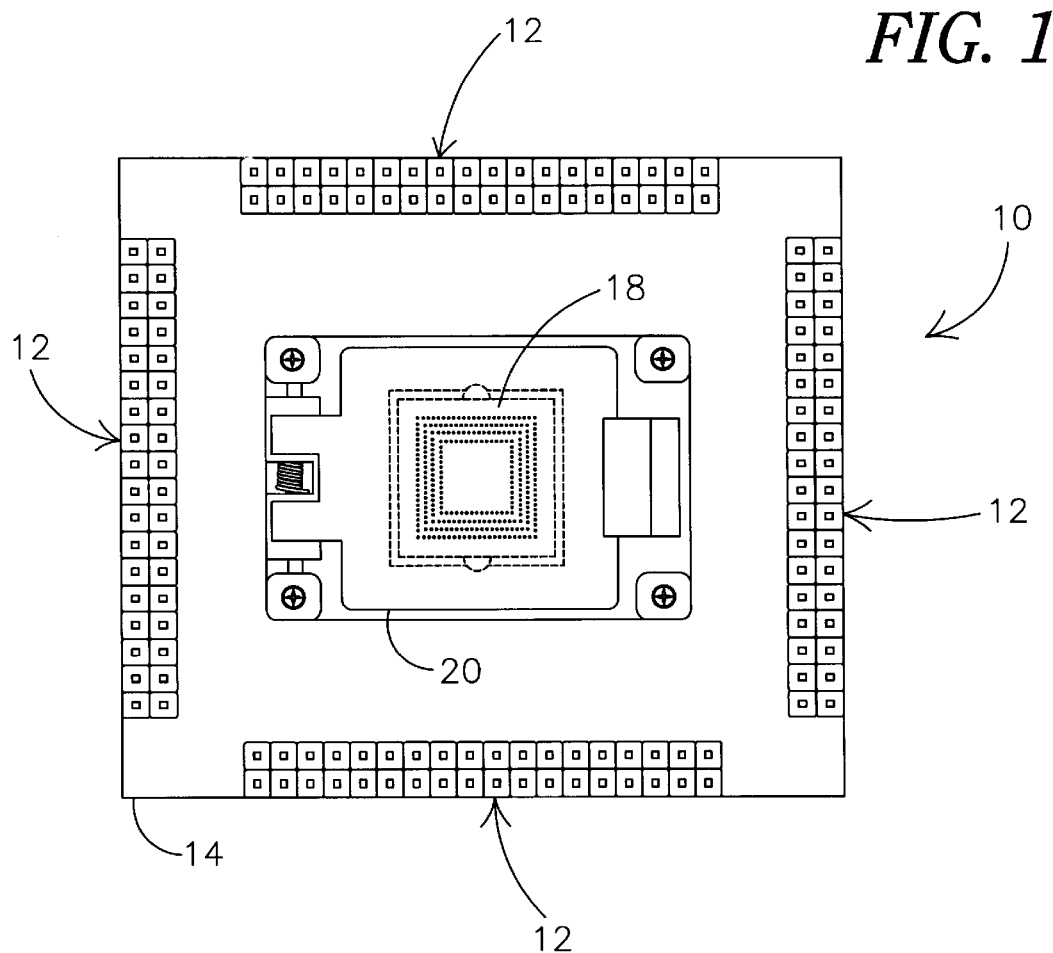
FIG. 1A is a top view of a component adapter assembly employing an adapter apparatus according to the present invention.
Figure 1B:
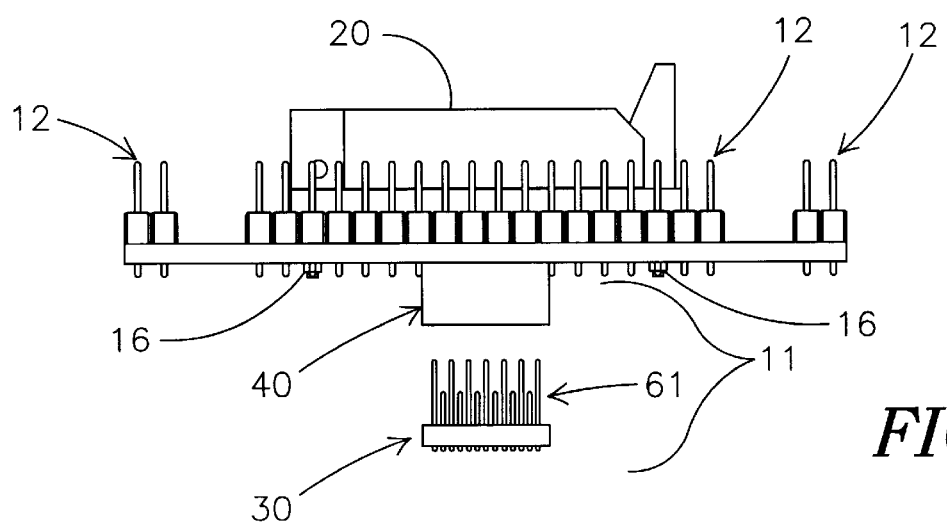
FIG. 1B is a partially exploded side view of the component adapter assembly shown in FIG. 1A.

FIGS. 1A and 1B show a top view and a partially exploded side view, respectively, of a component adapter assembly 10 employing an adapter apparatus 11 according to the present invention. Generally, the component adapter assembly 10 is for mounting on a target board 50, as shown in FIG. 2.

Component adapter assembly 10 employs the adapter apparatus 11 according to the present invention which includes a pin adapter 30 and a socket adapter device 40. The socket adapter device 40 is configured for electrical connection to a socket interface component 20. The socket interface component 20 is capable of mounting a circuit component 18, e.g., a ball grid array package component, therein. For example, the socket interface component 20 may be a commercially available ZIF socket interface or some other like interface components such as those which allow integrated circuit packages to be easily replaced within the interface component.

Figure 2:
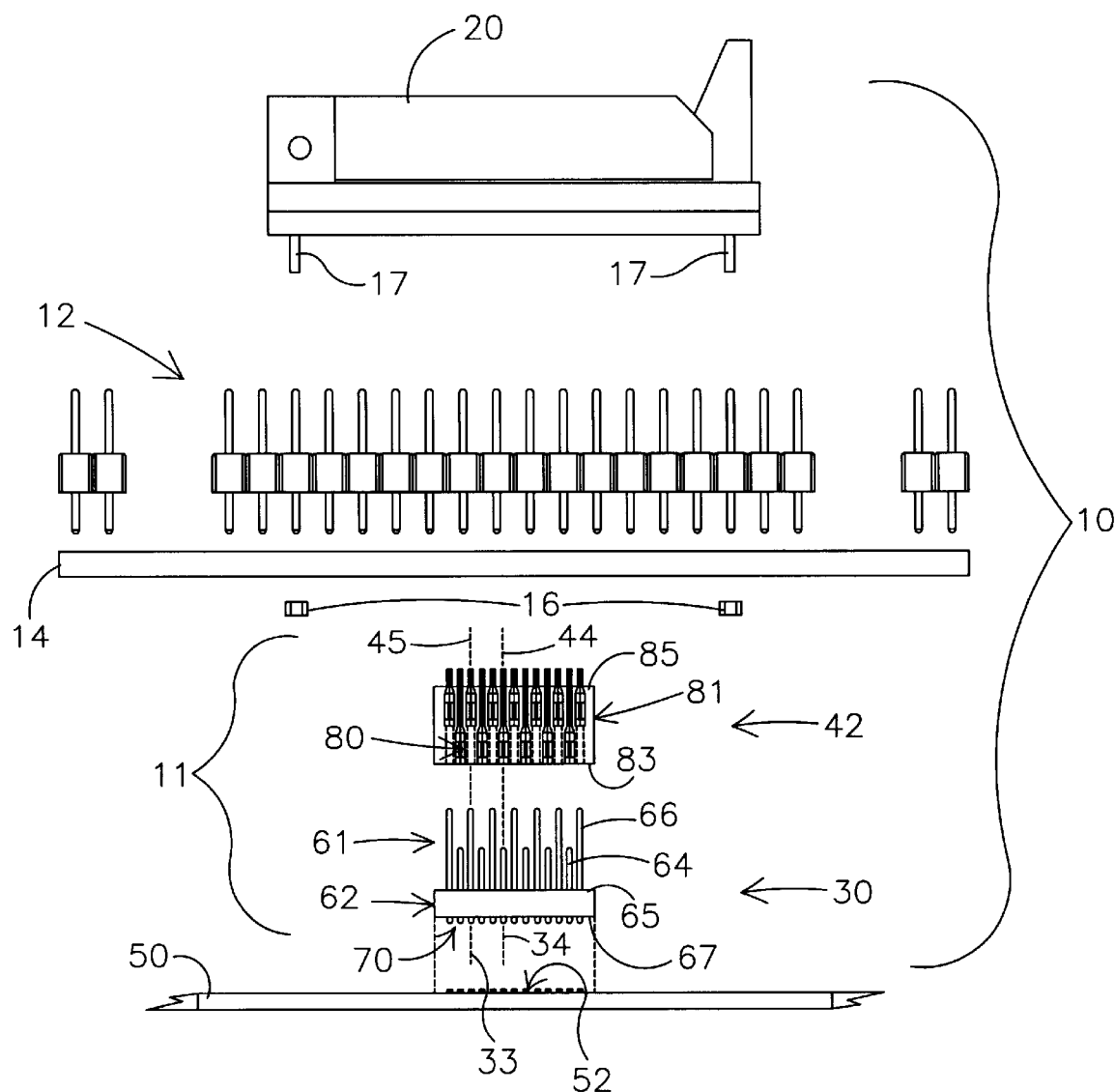
FIG. 2 is a further exploded side view, including a cross-section illustration of a socket device embodiment, of the component adapter assembly shown in FIG. 1A.

The socket interface component 20 is mounted with respect to a printed circuit board 14, e.g., a probe board, a daughter board, etc., using fastening elements or structures such as nuts 16 and threaded posts 17 (see FIG. 2). The board 14 includes electrically conductive elements for connection of the circuit component 18 mounted in the socket interface component 20 to test pins 12 distributed along the edges of printed circuit board 14. As such, and as generally illustrated by FIG. 1A, when circuit component 18 is mounted in the interface component 20, and with use of the adapter apparatus 11 according to the present invention, the functionality of the circuit component 18 and/or target board 50 (see FIG. 2) may be tested at test pins or test points 12. As such, test and debug procedures, such as for target boards and/or high density integrated circuit packages, e.g., such as ball grid array packages, can be performed without damage to the high density packages.

Figure 8:
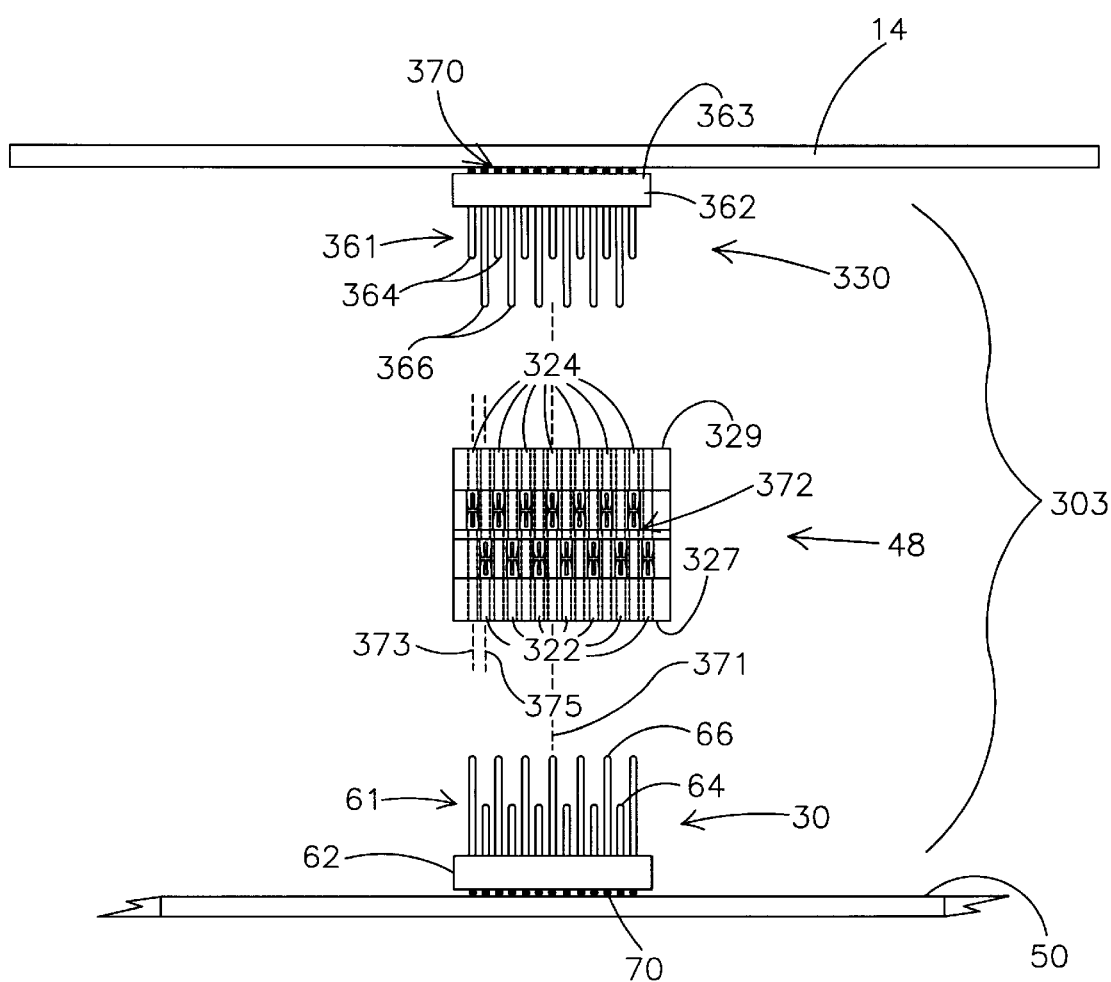
FIG. 8 is an exploded cross-section view of an adapter apparatus including two pin adapters and a female-to-female socket device according to the present invention.

The socket interface component 20 may be any interface component configured for operation with the adapter apparatus 11 of the present invention. For example, with respect to the embodiment of the socket device 42 shown in FIG. 2, the socket interface component 20 may be a commercially available ZIF socket having female socket portions for accepting pins from the socket device 42 as further described below. Further, for example, the socket interface component 20 may be a commercially available ZIF socket directly mounted via surface mount techniques to probe board 14 with the circuit component 18 electrically connected through the socket interface component 20 to pads provided on an underside of the daughter board as shown in FIG. 8 for use with the adapter apparatus 303 as shown therein. As such, various configurations for the socket interface component 20 may be used, and those provided herein are provided for illustration only. Preferably, such socket interface components 20 include thru hole or surface mount options. The printed circuit board 14, e.g., probe board, may be formed of any insulative material having suitable electrical pads and interconnection elements for electrical connection of the circuit component 18 to the test points or pins 12 about the perimeter of the board 14.

Generally, as shown in FIG. 1B, the adapter apparatus 11 according to the present invention includes the pin adapter 30 and the socket adapter device 40. Preferably, the adapter apparatus 11 is approximately the same length and width as the integrated circuit package circuit component 18 with which it is used. Preferably, the adapter apparatus 11 includes a surface mount pin adapter 30 including elongated terminal pins 61 have varying lengths, e.g., various pins may be of a first length and other pins may be of a second length. The socket adapter device 40 generally is a pluggable socket for receiving the terminal pins 61 of the pin adapter 30 having varying lengths. Preferably, the pluggable socket adapter device 40 includes socket elements offset in the direction of the axis of the socket device, e.g., in the height direction.

Preferably, the adapter apparatus 11 is used with very high density ball grid array packages; high density being preferably defined as those with a pitch of about 0.8 mm or less. However, other packages may also benefit from the present invention. Further, preferably, the adapter apparatus 11 may be mounted on a target board 50 as shown in FIG. 2 without any holes being formed therein such as with use of flux and reflow methods as are conventionally known in the art. The adapter apparatus 11 allows for very high speed application of the circuit component 18 functioning with the remainder of the circuit or circuits (not shown) mounted on target board 50.

Figure 9:
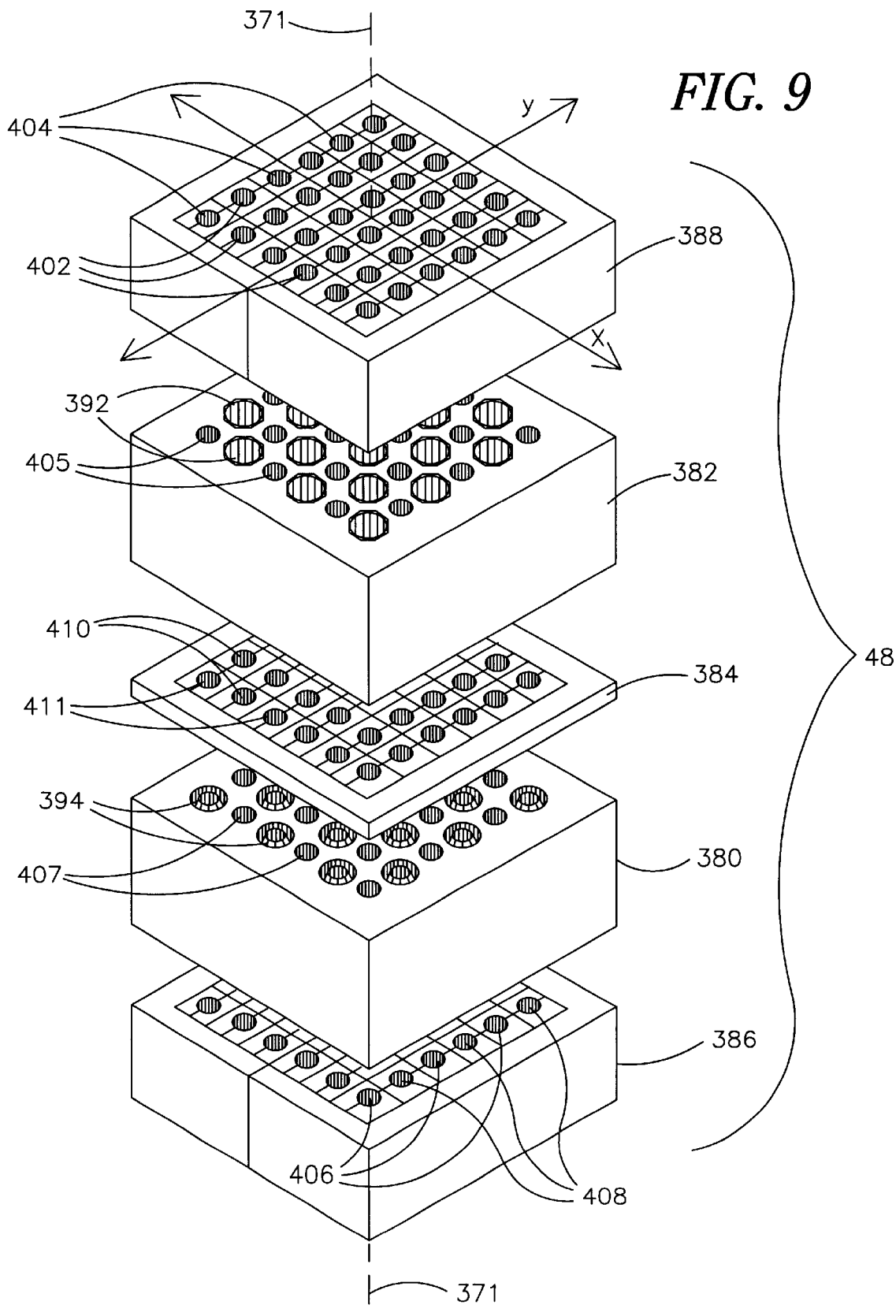
FIG. 9 is an exploded top perspective view of the female-to-female socket device of FIG. 8.
Figure 10:
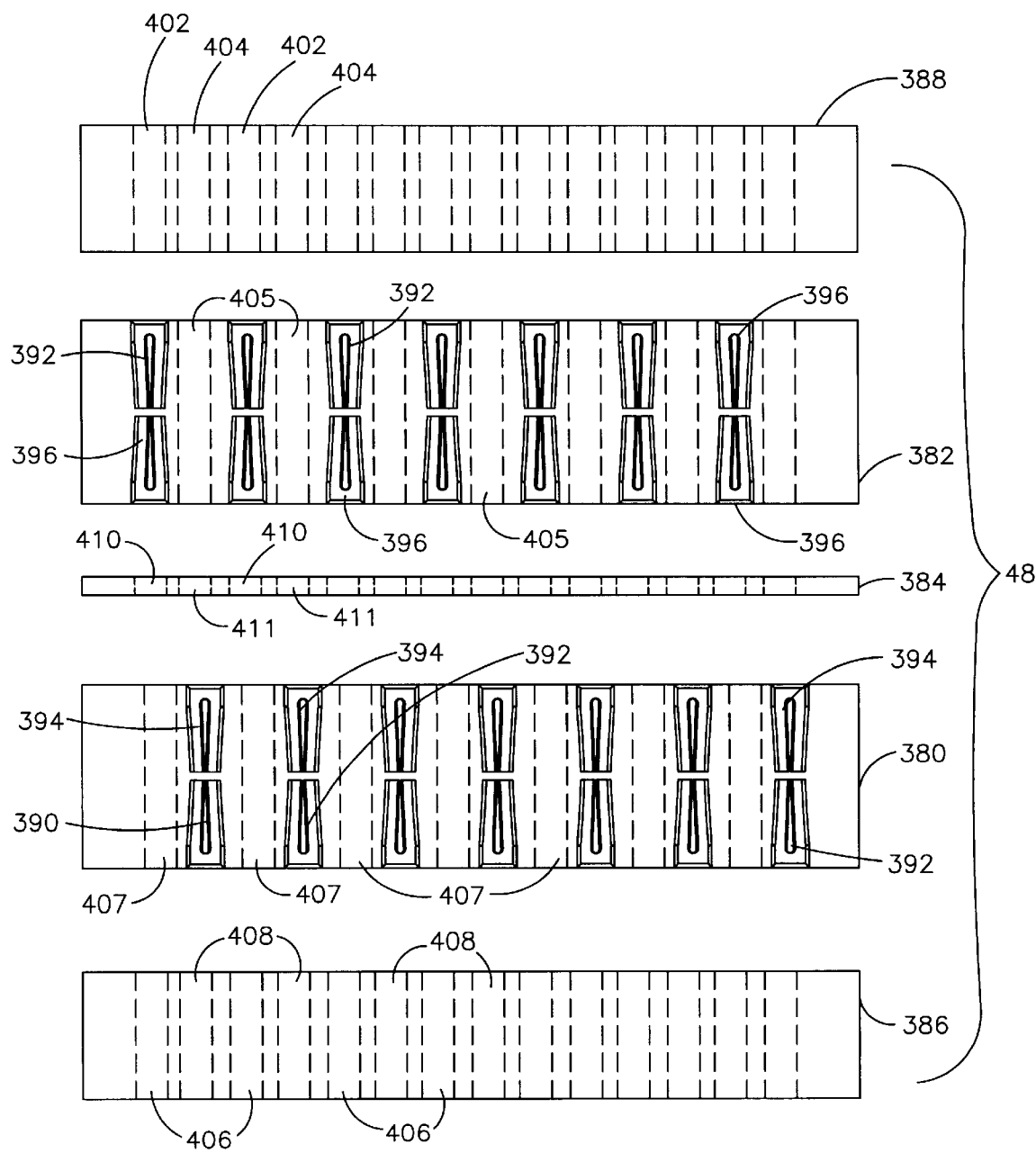
FIG. 10 is an exploded cross-section view of the female-to-female socket device of FIG. 8.

Various embodiments of the adapter apparatus 11 shall be described below with reference to FIGS. 2–10. For example, it will be recognized that the pin adapter 30 as described below may be used with a female-to-male socket device 42 as shown and described with reference to FIGS. 2–6, may be used in assembly of multiple probe boards as shown in the embodiment described with reference to FIG. 7, and may be employed with a female-to-female socket device 48 as shown and described with reference to FIGS. 8–10. It will be recognized that as shown in FIGS. 8–10, two pin adapters 30 and 330 may be used with the female-to-female socket device 48 to provide connection of circuit component 18 to target board 50.

The pin adapter 30 shall be described with reference to FIGS. 2, 3, and 6. A side view of the pin adapter 30 is shown in FIG. 2, a bottom perspective view of the pin adapter 30 is shown in FIG. 3, and a cross-section view of the pin adapter 30 is shown in FIG. 6.

Pin adapter 30 includes a pin adapter body member 62 having a length along an adapter axis 31 between an upper end 65 and a lower end 67. For example, the upper end 65 and lower end 67 may be parallel to one another with sides walls connecting the ends. Preferably, the pin adapter body member 62 is a substrate material with controlled depth holes defined therein for receiving terminal pins 61. Further, the pin adapter body member 62 of the pin adapter 30, as well as the socket body member of the socket device 40 as described further below, is formed of an insulative material, such as FR4, for providing insulative properties between the electrical components positioned therein, e.g., such as components assembled in the insulative material or inserted in openings defined therein.

Figure 3:
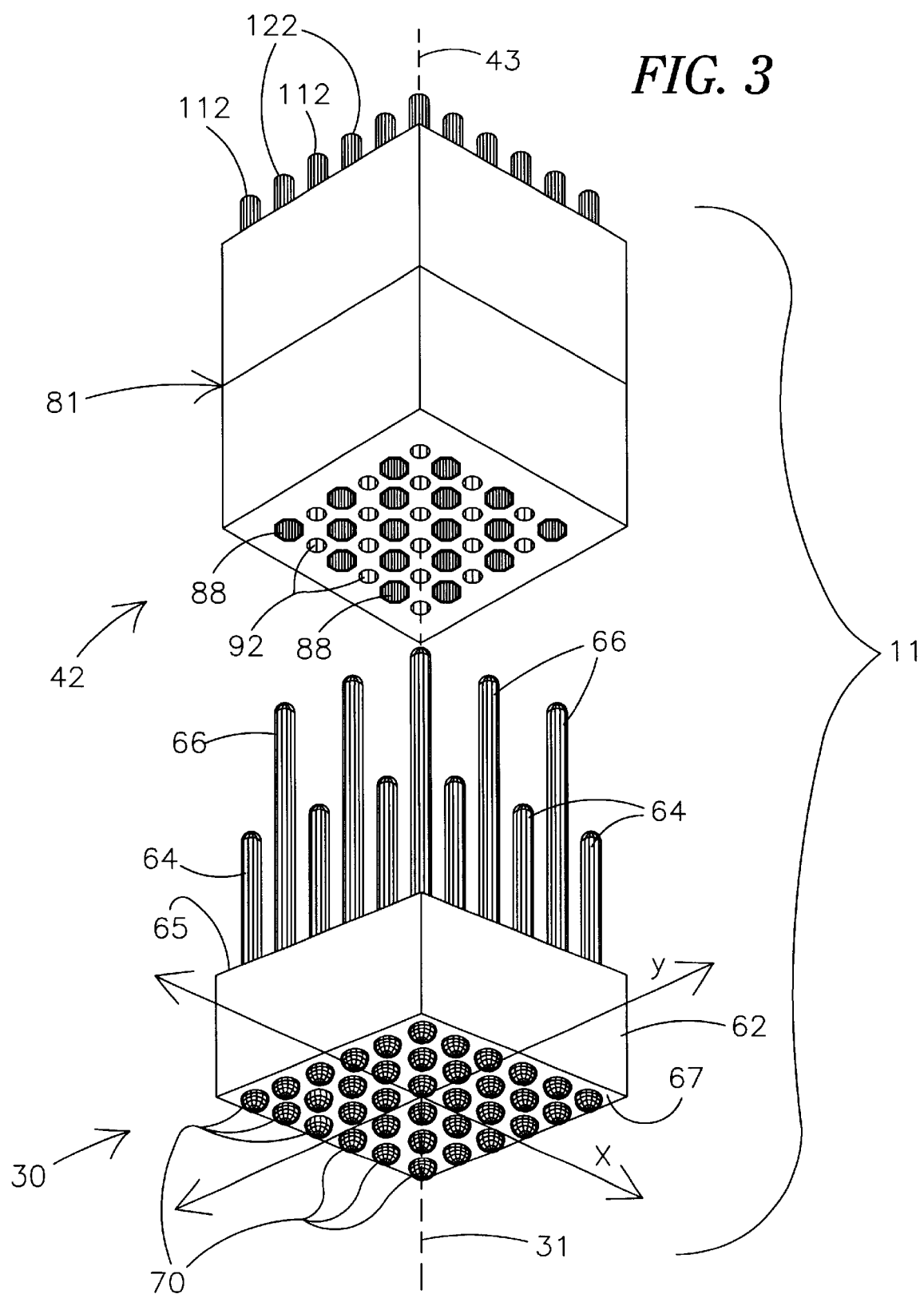
FIG. 3 is an exploded bottom perspective view of one embodiment of an adapter apparatus including a pin adapter and a female-to-male socket device according to the present invention.
Figure 6:
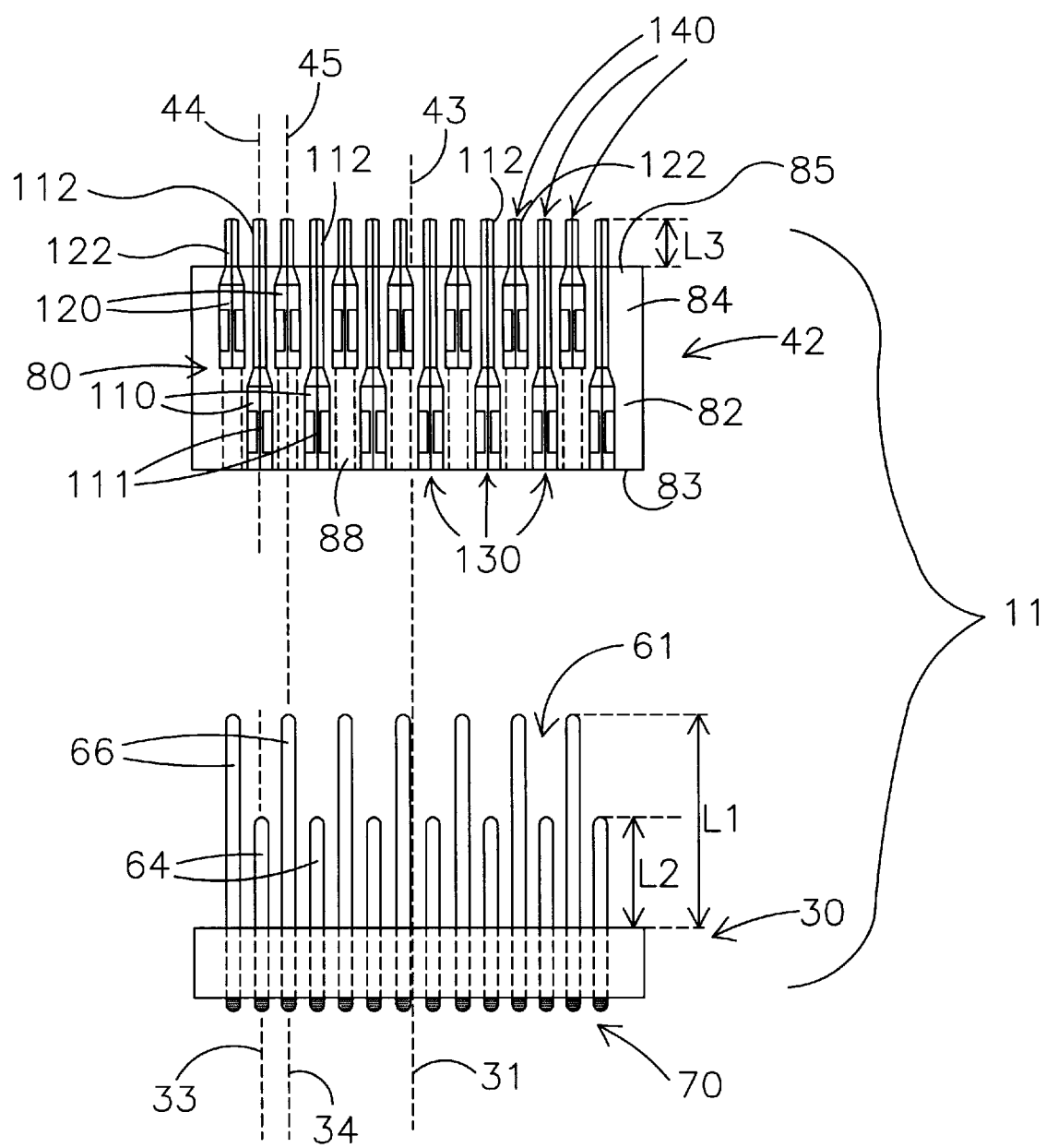
FIG. 6 is a cross-section exploded view of the adapter apparatus of FIG. 3, including a cross-section view of the female-to-male socket device and a cross-section view of the pin adapter thereof.

As shown in FIGS. 2, 3, and 6, the pin adapter 30 includes an array of contact elements 70 disposed at the lower end 67 of the pin adapter body member 62. Preferably, the contact elements 70 are an array of solder spheres. Further, preferably, the solder spheres are configured in rows and columns lying in an x-y plane perpendicular to the pin adapter axis 31 as particularly shown in FIG. 3.

One skilled in the art will recognize that the contact elements 70 may be any contact element utilized in integrated circuit packaging. For example, such contact elements 70 may be solder spheres as previously described, as well as other surface mount contact elements such as, for example, solder bumps or gull wing leads, and non-surface mount contact elements such as pins.

As shown in FIGS. 2, 3, and 6, terminal pins 61 include at least one elongated terminal pin having a different length in the direction of the pin adapter axis 31 than the other terminal pins 61. Such varying of terminal pin heights accommodates a finer pitch for the pins. Preferably, as is best shown in the cross-sectional view of FIG. 6, the terminal pins 61 include a first set of terminal short pins 64 having a length (L2) extending beyond the upper end 65 of the body member 62 in the direction of the adapter axis 31. Each of the terminal short pins 64 have a pin axis 33 therethrough lying parallel to the adapter axis 31. Further, the terminal pins 61 include a second set of terminal long pins 66 having a length (L1) extending beyond the upper end 65 of the body member 62 in the direction of the adapter axis 31. Each terminal long pin 66 includes a pin axis 34 extending therethrough parallel to the adapter axis 31. Each of the terminal pins 61 is positioned in holes defined in the substrate material of the pin adapter body member 62 such that they are in electrical contact with the contact elements 70, e.g., solder spheres.

Preferably, the electrically conductive terminal pins 61 are formed of any suitable conductive material, e.g., beryllium copper with gold plating. The substrate material, e.g., FR4, of the pin adapter body member 62 provides for thermal and electrical isolation of the terminal pins 61 from one another. Preferably, the contact elements 70 are such that they can be directly mounted to a printed circuit board or a target board 50 without any holes being required in the target board, e.g., such as with use of flux and reflow methods.

As shown in FIG. 2, solder spheres 70 are surface mountable on contact pads 52 of target board 50. Preferably, each terminal pin 61 is terminated in a square head at the lower end 67 within the pin adapter body member 62. The square head has a conical apex for pressing the terminal pin 61 into the pin adapter body member 62.

Therefore, in summary, the pin adapter 30 includes an array of elongated terminal pins 61. The elongated terminal pins 61 include at least one pin that is of a different length than another pin of the array. Preferably, the elongated terminal pins 61 include a first set of terminal long pins 66 and a second set of terminal short pins 64. The sets of elongated terminal pins have different lengths, e.g., they extend past the body member 62 by different distances. At least one elongated pin of the first set is preferably positioned between two terminal pins of the second set. Preferably, such elongated terminal pins 61 are configured in rows and columns with the rows and columns of elongated pin elements arranged along x and y axes perpendicular to the adapter axis 31. Further, preferably, each elongated pin element is of a different length than elongated terminal pins adjacent thereto along the x and y axes.

One skilled in the art will recognize that terminal pins 61 may include pins of more than two different lengths in accordance with the present invention. For example, terminal pins 61 may include three sets of pins with each set being of a different length, four sets of pins with each set having pins of a different length than the other sets, etc. As will be recognized, the socket device configuration as described further below will also vary according to the different number of sets of terminal pins having different lengths, as the socket device 40 is configured to receive and retain the terminal pins having the varying lengths.

FIG. 2 shows the pin adapter 30 employed in component adapter assembly 10 in conjunction with a female-to-male pluggable socket device 42. As indicated above, the female-to-male socket device 42 is shown in cross-section view in FIGS. 2 and 6. Further, socket device 42 is shown in a bottom perspective view in FIG. 3 and a top perspective view in FIG. 4. Yet further, the female-to-male socket device 42 is shown in an exploded top perspective view of FIG. 5.

As shown in the various figures, female-to-male adapter socket device 42 includes a socket body member 81 having a length along a socket axis 43 between a lower body member end 83 and an upper body member end 85. For example, as shown illustratively in the figures, the lower body member end 83 and the upper body member end 85 are generally parallel to one another and connected by side walls.

The socket adapter device 42 includes an array of socket elements 80 arranged in the socket body member 81 generally parallel to the socket axis 43. The array of socket elements 80 are configured in the socket body member 81 to receive the array of terminal pins 61 of pin adapter 30. As will be described further below, the socket elements 80 include conductive socket retaining portions which receive and retain the terminal pins 61 of the pin adapter 30. Such conductive socket retaining portions of different socket elements of the array 80 are offset relative to one another along the direction of the socket axis 43. In such a manner, for example, various elements of the socket elements 80 may be isolated thermally and electrically from one another by the insulating material of socket body member 81.

Figure 4:
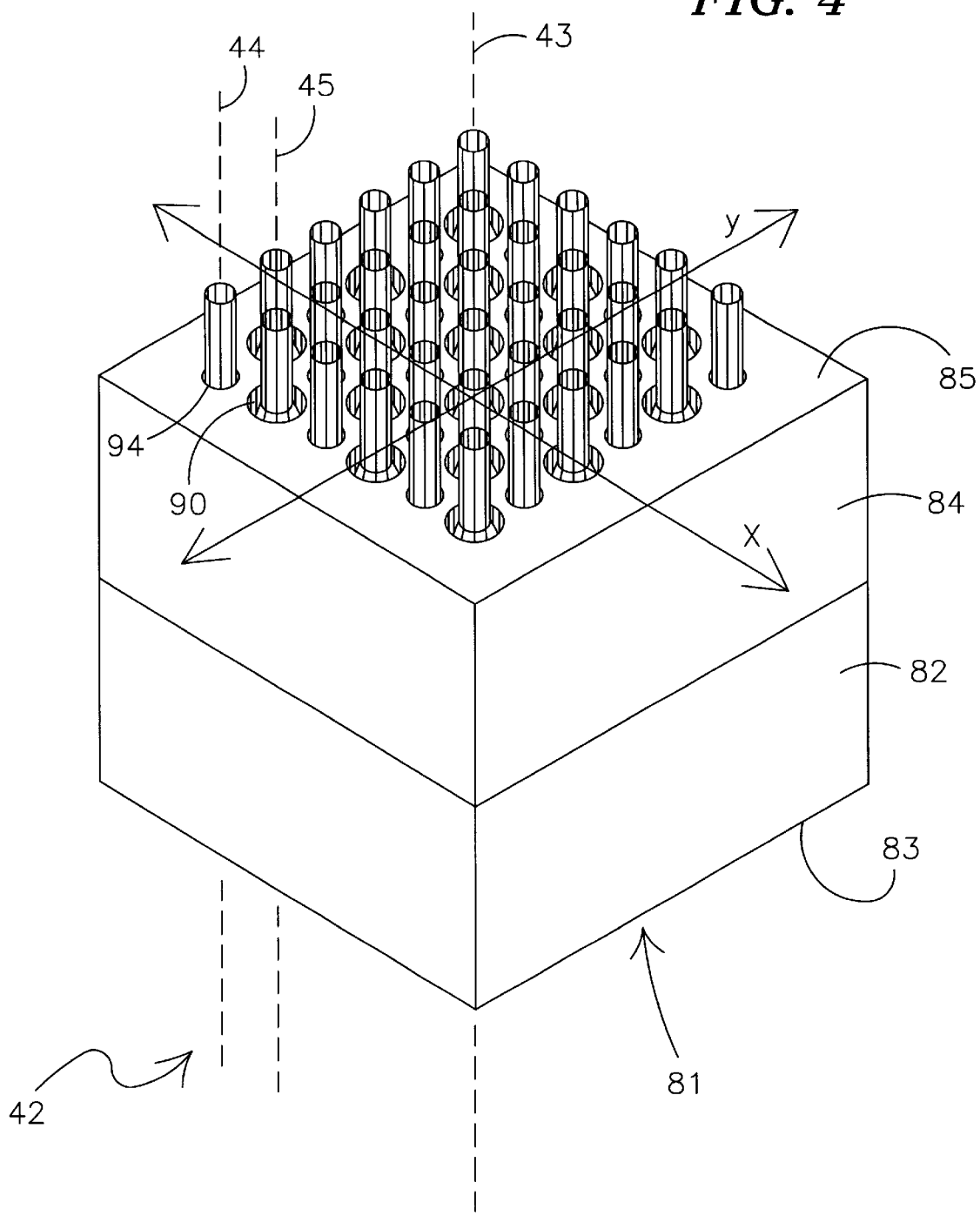
FIG. 4 is a top perspective view of the assembled female-to-male socket device of FIG. 3.
Figure 5:
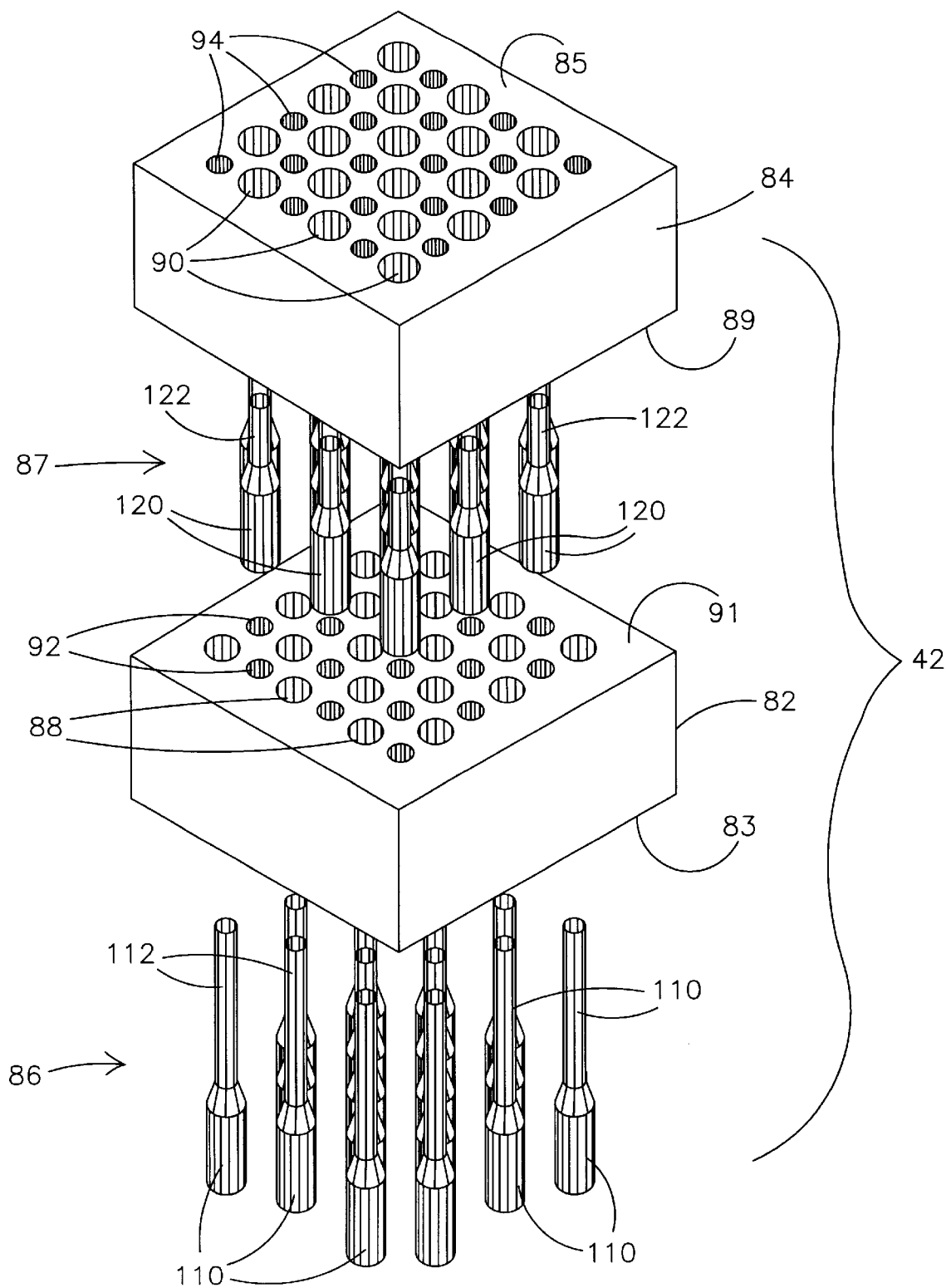
FIG. 5 is a further exploded top perspective view of the female-to-male socket device of FIGS. 3 and 4.

As shown in FIGS. 4, 5, and 6, the socket body member 81 of the socket adapter device 42 generally includes two substrate portions, first substrate portion 82 and second substrate portion 84. The first substrate portion 82 includes lower end 83 and opposing face 91. The second substrate portion 84 includes upper end 85 and an opposing face 89. When assembled, opposing faces 91 and 89 are preferably in contact with one another.

The adapter socket device 42 preferably includes two sets of socket pins assembled within the socket body member 81. The two sets include a first set of socket long pins 86 and a second set of socket short pins 87. Each of the first set of socket long pins 86 include a short pin conductive retaining portion 110 having extended therefrom a long pin portion 112. Each socket short pin of the second set of socket short pins 87 includes a long pin conductive retaining portion 120 with a short conductive pin portion 122 extending therefrom.

The first set of socket long pins 86 and second set of socket short pins 87 are generally assembled (e.g., affixed) in openings (e.g., countersunk openings), defined in the first and second substrate portions 82, 84 in a direction parallel to socket axis 43. Generally, the conductive retaining portions 110 of the first set of socket long pins 86 and the conductive retaining portions 120 of the second set of socket short pins 87 are offset in the direction of the socket axis 43 to allow for high density configuration of such socket pins.

Preferably, each of the conductive retaining portions 110, 120 include an integrated clip structure 111 (see FIG. 6) for retaining terminal pins 61 which are pluggable therein. Preferably, the socket pins 86, 87 are completely integrated with the clip structure 111, e.g., the clip structure is formed integrally as a single piece with the remainder of the socket pin. However, as one skilled in the art will recognize, any retaining structure may be used within the socket pins for retaining the terminal pins 61 pluggable therein. For example, such retaining structure may include ribbed structures, bump structures, clip structures or any other formed or stamped structures, etc.

The first substrate portion 82 includes countersunk socket retaining openings 88 defined therein for receiving short pin conductive retaining portions 110 of the first set of socket long pins 86. Further defined in the first substrate portion 82 are terminal long pin openings 92 for receiving portions of terminal pins 61 when the pin adapter 30 is plugged into socket device 42. Generally, the socket retaining openings 88 and terminal long pin openings 92 are configured in the first substrate portion 82 in the direction parallel to the socket axis 43, i.e., the axis through the center of the openings and socket pins is parallel to the socket axis 43. Further, the array of openings 88, 92 are arranged in rows and columns in an x-y axis coordinate system, as shown in FIG. 4, generally perpendicular to the socket axis 43. Each opening 88 is adjacent (although isolated from) one or more long pin openings 92 along; the x and y axes.

Further, second substrate portion 84 includes countersunk socket conductive retaining openings 90 for receiving long pin socket retaining portions 120 of the second set of socket short pins 87. Further, socket long pin retaining openings 94 are defined in the second substrate portion 84 for insertion of the long pin portions 112 of the first set of socket long pins 86. The openings 94 and 90 extend in the direction parallel to the socket axis 43, i.e., the axis through the center of the openings and socket pins is parallel to the socket axis 43. Further, the array of openings 90, 94 are arranged in rows and columns in an x-y axis coordinate system generally perpendicular to the socket axis 43, as shown in FIG. 4. Each opening 90 is adjacent (although isolated from) one or more long pin openings 94 along the x, and y axes. In other words, every other opening along a row is an opening 90 with openings 94 located therebetween and every other opening along a column is an opening 90 with openings 94 located therebetween.

As assembled, with all the portions aligned, as shown in FIG. 4 and the cross-section view of FIG. 6, the socket elements 80 extending in a direction parallel to socket axis 43 for receiving terminal pins 61 of pin adapter 30 generally include a first set of socket elements 140 for receiving and retaining terminal long pins 66 and a second set of socket elements 130 for retaining and receiving terminal short pins 64 of pin adapter 30. Generally, each of the socket elements includes a female portion, e.g., retaining portions 110 and 120, for receiving and retaining the terminal pin 61 and a male portion extending from the upper end 85 of the socket body member 81 forming the male portion of the female-to-male socket adapter device 42. Preferably, the pin portions 112 and 122 of the first set of socket long pins 86 and second set of socket short pins 87 are sized such that the portion extending beyond the upper end 85 of the socket body member 81 is of an equal length (L3) as shown in FIG. 6. However, as will be recognized, such portions extending beyond the end 85 may be of different lengths depending upon the openings in which they are to be inserted, e.g., openings of a ZIF socket, openings of a probe board, etc.

Each of the socket elements of the first set of socket elements 140 for receiving and retaining terminal long pins 66 include a socket retaining opening 88 in the first substrate portion 82 adjacent the lower end 83 of the socket body member 81. Extending from the socket retaining opening 88 is the long pin conductive retaining portion 120 which then terminates in short conductive pin portions 122. The pin portion 122 extends beyond the upper end 85 of the socket body member 81 a particular distance. In other words, each socket element 140 provides a female to male connection through the socket body member 81 for the terminal long pins 66.

In a like manner, each of the socket elements of the second set of socket elements 130 for receiving and retaining the short terminal pins 64 include the short pin conductive retaining portion 110 which is open at the lower end 83 of the socket body member 81. Extending from the short pin retaining portion 110 is the elongated long pin portion 112 which extends beyond the upper end 85 of the socket body member 81 a particular distance. In other words, each socket element 130 provides a female to male connection through the socket body member 81 for the terminal short pins 64.

As is shown, particularly in FIG. 6, the conductive socket retaining portions 120 and 110 for receiving and retaining the different length terminal pins 66, 64, respectively, are offset from one another along the direction of the socket axis 43. In such a manner, the socket short pins 87 and socket long pins 86 can be adequately isolated (e.g, thermally and electrically) from one another. Further, when the pin adapter 30 and socket device 42 are assembled, the terminal pins 61 retained within the first and second sets of socket long and short pins 86, 87 can also be isolated from adjacent conductive elements. For example, as shown in FIG. 6, the openings 88 are adjacent and insulated from the conductive retaining portions 110. Further, for example, the conductive retaining portions 120 of the second set of socket short pins 87 are suitably insulated from conductive long pin portions 112 of adjacent socket long pins 86 of the first set of socket long pins 86.

Figure 7:
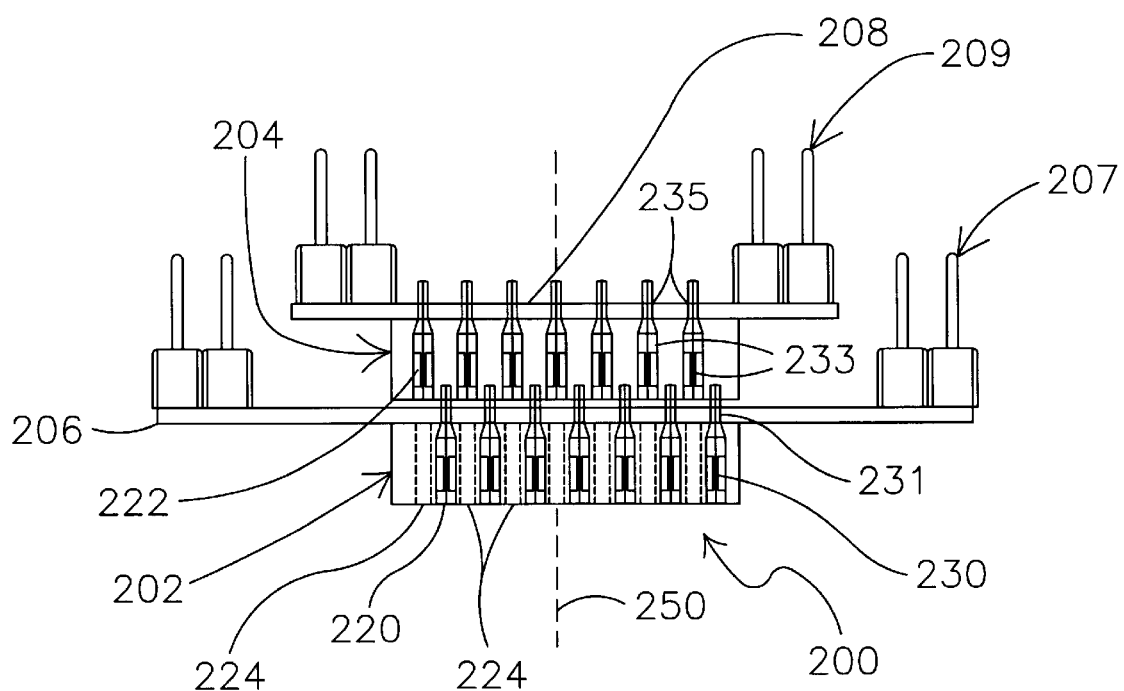
FIG. 7 is a cross-section view of an alternate embodiment of a socket device according to the present invention allowing for assembly of multiple printed circuit boards.

FIG. 7 shows an alternate embodiment of a socket device 200 for use when it is desired to assemble multiple boards, e.g., probe boards 206, 208. Generally, the socket device 200 includes a first substrate portion 202 which is separate from a second substrate portion 204. Each of the first and second substrate portions 202, 204 are configured with socket short pins 220 and 222, respectively, in much the same manner as described previously with reference to FIGS. 2–6. However, in this particular embodiment, the first and second substrates 202, 204 are separated by a probe board 206 which is inserted between the substrate portions 202 and 204. The probe board 206 includes openings wherein the socket short pins 220 can be inserted.

Generally, first substrate portion 202 includes long pin openings 224 for accepting terminal long pins 66 of a pin adapter 30 and socket short pins 220 for receiving and retaining terminal short pins 64 of a pin adapter 30. Substrate portion 204 generally includes socket short pins 222 for receiving and retaining terminal long pins 66 of pin adapter 30.

Each of the socket short pins 220 includes a conductive retaining portion 230 and a short pin portion 231 extending therefrom. Each of the socket short pins 222 includes a conductive retaining portion 233 and a short pin portion 235 extending therefrom. As shown in the assembled structure of FIG. 7, the short pin portions 231 are inserted in openings of first probe board 206 which includes electrical paths for connecting the short pin portions 231 to test points or pins 207 thereof. Likewise, the short pin portions 235 of socket short pins 222, inserted in countersunk openings of substrate portion 204, are configured for insertion in a second probe board 208 which includes electrical paths for connecting the conductive short pin portions 235 to test pins 209 thereof.

It will be recognized in the embodiment of FIG. 7, that the separate substrate portions 202 and 204 still utilize the technique of conductive retaining portions 230 and 233 offset in a direction parallel to a socket device axis 250 of the socket device 200. In such a manner as described with reference to FIGS. 2–6, conductive portions of the socket device are suitably isolated from each other, even considering the high density of such elements.

As shown by the configuration of FIG. 7, a socket device is capable of providing multiple probe board assembly to a single pluggable offset socket However, as shown in FIG. 7, the socket device 200 is formed with two separate socket substrate portions 202 and 204 separated by a probe board This embodiment is configured to facilitate testing of a target board 50 having a pin adapter 30 mounted thereon. With such a pin adapter 30 mounted to the target board 50, the socket device 200 can be plugged onto the pin adapter 30 and the target board 50 can be tested. In this embodiment a circuit component (e.g., component 18) is not mounted relative to the probe board 208. Rather, both the test points 207 and 209 are used to test a target board 50 with which a pin adapter 30 and socket device 200 are used.

FIGS. 8–10 show yet another alternate embodiment of a socket device 40 for use with pin adapter 30. As shown therein, a female-to-female socket device 48 is provided and which is pluggable in opposing directions to two separate pin adapters 30, 330. As such, adapter apparatus 303 shown in FIG. 8 includes pin adapter 30, pin adapter 330, and female-to-female socket device 48. The pin adapter 30 is substantially equivalent to that shown and described with reference to FIGS. 2–6. As such, it includes terminal pins 61 including terminal long pins 66 and terminal short pins 64. Likewise, the pin adapter 30 includes contact elements 70, e.g., solder spheres, disposed on one end thereof for mounting on target board 50.

In a like manner, pin adapter 330 is substantially equivalent to that of pin adapter 30. It includes an array of terminal pins 361. Terminal pins 361 include a set of terminal long pins 366 and a set of terminal short pins 364. Likewise, pin adapter 330 includes substrate or adapter body member 362. On one end 363 of the adapter body member 362 are an array of contact elements 370, e.g., solder spheres, for mounting on printed circuit board 14, e.g., daughter board, probe board, etc.

The female-to-female socket device 48 includes a socket body member 372 formed of multiple substrates having a length along socket axis 371 between a first end 327 and a second end 329 thereof. Further, the female-to-female socket device 48 includes a first set of socket elements 322 generally configured to accept and retain terminal long pins 66 of pin adapter 30 and terminal short pins 364 of pin adapter 330. Yet further, the socket device 48 includes a second set of socket elements 324 configured to receive terminal short pins 364 of pin adapter 30 and terminal long pins 366 of pin adapter 330. Generally, the socket elements extend from a first lower end 327 of the socket device 48 to an upper end 329 of the socket device 48 through various substrate portions thereof, as further described below. Generally, each of the socket elements of the first and second sets of socket elements 322, 324 extend generally parallel to socket axis 371. As shown in the cross-section assembled view of female-to-female socket device 48 in FIG. 8, conductive retaining portions for receiving and retaining the terminal pins 61, 361 of respective pin adapters 30, 330 are offset in the direction of the socket axis 371 from one another to provide for adequate isolation between such conductive elements and between the terminal pins 61, 361 plugged into socket device 48. Each of the socket elements 322 have a socket element axis 375 extending therethrough parallel to the socket axis 371 and each of the socket elements 324 have a socket element axis 373 extending therethrough parallel to the socket axis 371.

FIG. 9 shows an exploded top perspective view of a female-to-female socket device 48 and FIG. 10 shows an exploded cross-section view of such a socket device. As shown therein, the female-to-female socket device 48 is formed of five substrate portions, although any number of substrate portions may be used to form such devices, as well as any of the other socket devices and pin adapter substrate body members as described elsewhere herein. As shown in FIG. 9, this illustrative embodiment of the female-to-female socket device 48 includes pin receiving substrates 386 and 388 which form the upper and lower portions of the socket device 48. Sandwiched therebetween are socket retaining substrates 380 and 382 which are isolated from one another by alignment and insulating substrate 384.

As shown in FIGS. 9 and 10, pin receiving substrate 386 generally includes long pill receiving openings 406 which are configured for receiving terminal long pins 66 of pin adapter 30 and short pin receiving openings 408 which are configured for receiving terminal short pins 64 of pin adapter 30. Likewise, pin receiving substrate 388 has defined therein short pin receiving openings 402 configured for receiving terminal short pins 364 of pin adapter 330 and long pin receiving openings 404 configured for receiving terminal long pins 366 of pin adapter 330. As shown in FIG. 9, such an array of openings is arranged along x-y axes generally perpendicular to socket axis 371. Generally, such openings provide for the receiving of the various terminal pins and also are formed of insulating material, e.g., FR4 substrate material, to provide adequate isolation between the terminal pins of the pin adapters 30, 330.

Socket retaining substrate 380 includes long pin receiving openings 407 for receiving terminal long pins 66 of pin adapter 30 and further includes back-to-back conductive socket retaining portions 390, 394. The back-to-back retaining portions include short pin socket retaining portions 390 configured for receiving terminal short pins 64 of pin adapter 30 and long pin socket conductive retaining portions 394 configured for receiving terminal long pins 366 of pin adapter 330. Likewise, socket retaining substrate 382 includes long pin receiving openings 405 configured for receiving terminal long pins 366 of pin adapter 330 and back-to-back conductive retaining portions 392, 396 The back-to-back conductive retaining portions of substrate 382 include conductive short pin conductive retaining portions 392 configured for receiving terminal short pins 364 of pin adapter 330 and long pin socket retaining portions 396 configured for receiving and retaining terminal long pins 66 of pin adapter 30 Each of back-to-back retaining portions include retaining portions open in opposing directions along the socket element axis, e.g., 373, 375, parallel to the socket axis 371.

Alignment and insulating substrate 384 is sandwiched between the socket retaining substrates 380, 382 to provide for isolation of conductive retaining portions For example, such isolation is provided between long pin socket retaining portions 396 and long pin socket retaining portions 394. As such, the alignment and insulative substrate 384 includes pin openings 410 for receiving terminal long pins 66 of pin adapter 30 and pin openings 411 for receiving terminal long pins 366 of pin adapter 330.

The conductive retaining portions and openings are all aligned and the substrates assembled into the socket device 48 to provide for the first and second set of socket elements 322, 324 extending through the female-to-female socket device from lower end 327 to upper end 329 thereof The various elements of the socket device 48, e.g., retaining portions, openings, etc., are generally configured in rows and columns in an x and y direction generally orthogonal to socket axis 371 as shown in FIG. 9. As assembled, the first set of socket elements 322 generally is formed by long pin receiving openings 406, 407, and opening 410, in addition to back-to-back conductive retaining portions 392, 396. Further, each of the first set of socket elements 322 includes short pin receiving opening 402. In other words, each socket element 322 provides a female to female connection through the socket device for the terminal short pins 64 of pin adapter 30 and terminal long pins 366 of pin adapter 330.

Likewise, each of the second socket elements 324 includes long pin receiving opening 404, 405, and opening 411, in addition to back-to-back conductive retaining portions 390 and 394. Further, each of the socket elements of the second set of socket elements 324 includes short pin opening 408. In other words, each socket element 324 provides a female to female connection through the socket device for the terminal long pins 66 of pin adapter 30 and terminal short pins 364 of pin adapter 330.

One skilled in the art will recognize that the pin receiving substrates 386 and 388 provide for insulative structure and orientation of terminal pins 61 and 361, respectively. Such functionality may be provided by other insulative structures. Generally, the benefits from the present invention are particularly provided by the offset nature of the conductive retaining portions in the direction of the socket axis 371. By offsetting such conductive retaining portions in the socket retaining substrates 380, 382, various conductive portions can be isolated from one another and from terminal pins inserted therein while still achieving the density required for such conductive elements in an adapter apparatus capable of providing adequate functionality for high density integrated circuit packages, e.g., ball grid arrays. For example, long pin receiving opening 407 is adjacent and isolated from conductive retaining portions 390, 394. Likewise, long pin receiving openings 405 are adjacent and isolated from back-to-back conductive retaining portions 392, 396.

One skilled in the art will recognize that the various illustrative embodiments for the socket devices are not limited to the illustrative embodiments provided herein. For example, other configurations using offset conductive retaining portions may be possible and clearly fall within the scope of the present invention. Further, other configurations of pin adapters having terminal pins of varying lengths may also be provided and clearly fall within the scope of the present invention. It will be apparent from the figures herein that the cross-section drawings generally include more openings, pins, etc. than the perspective illustrations. This has been deliberately done to show the ability to form this adapter with a very high density of interconnect components within the device with use of the present invention.

All patents and references cited herein are incorporated in their entirety as if each were incorporated separately. This invention has been described with reference to illustrative embodiments and is not meant to be construed in a limiting sense. As described previously, one skilled in the art will recognize that various other illustrative applications may be provided which utilize the offset nature of the conductive portions described herein to provide for adapter apparatus for high density packaged integrated circuits. Various modifications of the illustrative embodiments, as well as additional embodiments of the invention, will be apparent to persons skilled in the art upon reference to this description. It is therefore contemplated that the patented claims will cover any such modifications or embodiments that may fall within the scope of the present invention as defined by the accompanying claims.

What is claimed is:

1. An adapter apparatus comprising:
    an adapter body member having a length along an adapter axis between a first adapter end and a second adapter end;
    an array of contact elements disposed on the first adapter end of the adapter body member;
    an array of elongated pin elements, wherein each elongated pin element corresponds to one of the array of contact elements and extends parallel to the adapter axis from a corresponding contact element through the adaptor body member and the second adapter end thereof, and further wherein the array of elongated pin elements include at least a first set of elongated pin elements having a first length and a second set of elongated pin elements having a second length; and
    wherein the apparatus further includes a socket device to receive the array of elongated pin elements, wherein the socket device includes:
        a socket body member having a length along a socket axis between a first body member end and a second body member end thereof; and
        an array of socket elements arranged in the socket body member generally parallel to the socket axis as a function of the array of elongated pin elements, each socket element extending at least between the first body member end and the second body member end, wherein the array of socket elements include at least a first set of socket elements and a second set of socket elements, wherein the socket elements of the first set comprise conductive socket retaining portions to receive and retain the elongated pin elements having the first length and the socket elements of the second set comprise conductive socket retaining portions to receive and retain the elongated pin elements having the second length, wherein the conductive socket retaining portions of the first set are offset along the direction of the socket axis from conductive socket retaining portions of the second set.

2. The apparatus of claim 1, wherein at least one of the elongated pin elements of the first set is positioned between two elongated pin elements of the second set.

3. The apparatus of claim 2, wherein the array of elongated pin elements includes rows and columns of elongated pin elements, wherein the rows and columns of elongated pin elements are arranged along x and y axes perpendicular to the adaptor axis, and further wherein each elongated pin element is of a different length than elongated pin elements adjacent thereto along the x and y axes.

4. The apparatus of claim 1, wherein the array of contact elements include an array of solder spheres.

5. The apparatus of claim 1, wherein the socket device is installed on a printed circuit board configured to receive a zif socket.

6. The apparatus of claim 1, wherein the elongated pin elements are terminated in a square head with a conical apex.

7. An adapter apparatus comprising:
    an adapter body member having a length along an adapter axis between a first adapter end and a second adapter end;
    an array of contact elements disposed on the first adapter end of the adapter body member;
    an array of elongated pin elements, wherein each elongated pin element corresponds to one of the array of contact elements and extends parallel to the adapter axis from a corresponding contact element through the adaptor body member and the second adapter end thereof, wherein the array of elongated pin elements include at least a first set of elongated pin elements having a first length and a second set of elongated pin elements having a second length, and further wherein at least one of the elongated pin elements of the first set is positioned between two elongated elements of the second set; and
    wherein the apparatus further includes a socket device to receive the array of elongated pin elements, wherein the socket device includes:
        a socket body member having a length along a socket axis between a first body member end and a second body member end thereof; and
        an array of socket elements arranged in the socket body member generally parallel to the socket axis as a function of the array of elongated pin elements, each socket element extending at least between the first body member end and the second body member end, wherein the array of socket elements includes at least a first set of socket elements and a second set of socket elements, wherein the first set of socket elements is provided in the socket body member to receive the first set of elongated pin elements having the first length and a second set of socket elements is provided in the socket body member to receive the second set of elongated pin elements having the second length, and wherein each of the first set of socket elements include:
            an opening portion defined in the socket body member adjacent the first body member end,
            a conductive socket retaining portion extending from the opening to receive and retain the elongated pin element having the first length, and
            a conductive pin element portion extending from the conductive socket retaining portion extending through and beyond the second body member end; and
        further wherein each of the second set of socket elements include:

a conductive socket retaining portion adjacent the first body member end, and
a conductive pin element portion extending from the conductive socket retaining portion extending through and beyond the second body member end.

8. The apparatus of claim 7, wherein the conductive pin element portions of the socket elements of the first set and second set extend beyond the second body member end by an equal distance.

9. The apparatus of claim 7, wherein the opening portion of the socket elements of the first set are adjacent and insulated from the conductive socket retaining portions of the second set.

10. The apparatus of claim 7, wherein the conductive socket retaining portions of the socket elements of the first set are adjacent and insulated from the conductive pin element portions of the second set.

11. An adapter apparatus comprising:
an adapter body member having a length along an adapter axis between a first adapter end and a second adapter end;
an array of contact elements disposed on the first adapter end of the adapter body member;
an array of elongated pin elements, wherein each elongated pin element corresponds to one of the array of contact elements and extends parallel to the adapter axis from a corresponding contact element through the adaptor body member and the second adapter end thereof, wherein the array of elongated pin elements include at least a first set of elongated pin elements having a first length and a second set of elongated pin elements having a second length, and further wherein at least one of the elongated pin elements of the first set is positioned between two elongated elements of the second set; and
wherein the apparatus further includes a socket device to receive the array of elongated pin elements, wherein the socket device includes:
a socket body member having a length along a socket axis between a first body member end and a second body member end thereof; and
an array of socket elements arranged in the socket body member generally parallel to the socket axis as a function of the array of elongated pin elements, each socket element extending at least between the first body member end and the second body member end, wherein the array of socket elements includes at least a first set of socket elements and a second set of socket elements, wherein the first set of socket elements is provided in the socket body member to receive the first set of elongated pin elements having the first length and a second set of socket elements is provided in the socket body member to receive the second set of elongated pin elements having the second length, and wherein each of the first set of socket elements include:
an opening portion defined in the socket body member adjacent the first body member end,
a first conductive socket retaining portion extending from the opening portion to receive the elongated pin element having the first length,
a second conductive socket retaining portion extending from the first conductive socket portion open in the opposing direction, and
an opening portion defined adjacent the second body member end and extending to the second conductive socket retaining portion; and further wherein each of the second set of socket elements include:
an opening portion defined in the socket body member adjacent the first body member end,
a first conductive socket retaining portion extending from the opening portion to receive the elongated pin element having the second length,
a second conductive socket retaining portion extending from the first conductive socket retaining portion open in the opposing direction, and
an opening portion defined adjacent the second body member end and extending to the second conductive socket retaining portion.

12. The apparatus of claim 11, wherein the opening portions of the socket elements of the first set adjacent the first body member end are adjacent and insulated from the first and second conductive socket retaining portions of the second set.

13. The apparatus of claim 11, wherein the opening portions of the socket elements of the second set adjacent the second body member end are adjacent and insulated from the first and second conductive socket retaining portions of the first set.

14. The apparatus of claim 11, wherein the apparatus further comprises an additional adapter body member having a length along an adapter axis thereof between a first adapter end and a second adapter end of the additional adapter body member, wherein an additional array of contact elements are disposed on the first adapter end of the additional adapter body member, wherein each elongated pin element of an additional array of elongated pin elements correspond to one of the array of contact elements and extends parallel to the adapter axis from a corresponding contact element through the additional adaptor body member and the second adapter end thereof, wherein one or more of the elongated pin elements of the additional array of elongated pin elements is of a different length than one or more other elongated pin elements, and further wherein the additional array of elongated pin elements are arranged to be received in the second set of socket elements.

15. An adapter apparatus comprising:
an adapter body member having a length along an adapter axis between a first adapter end and a second adapter end;
an array of contact elements disposed on the first adapter end of the adapter body member;
an array of elongated pin elements, wherein each elongated pin element corresponds to one of the array of contact elements and extends parallel to the adapter axis from a corresponding contact element through the adaptor body member and the second adapter end thereof, and further wherein one or more of the elongated pin elements of the array of elongated pin elements is of a different length than one or more other elongated pin elements; and
wherein the apparatus further includes a socket device to receive the elongated pin elements, wherein the socket device includes:
a first socket body member portion having a length along a socket axis between a first body member end and a second body member end thereof;
a second socket body member portion having a length along a socket axis between a first body member end and a second body member end thereof;
a first array of socket elements arranged in the first socket body member portion generally parallel to the socket axis thereof configured to receive elongated pin elements of a first length; and a second array of socket elements arranged in the second socket body member portion generally parallel to the socket axis thereof configured to receive elongated pin elements of a second length; and further wherein the apparatus comprises a printed wiring board positioned between the first and second socket body member portions of the socket device.

16. An adapter apparatus comprising:

a socket body member having a length along a socket axis between a first body member end and a second body member end thereof; and an array of socket elements arranged in the socket body member generally parallel to the socket axis configured to receive an array of elongated pin elements, wherein the array of sockets include at least a first set of socket elements and a second set of socket elements, wherein each of the socket elements of the first set include conductive socket retaining portions to receive and retain elongated pin elements having a first length and each of the socket elements of the second set include conductive socket retaining portions to receive and retain elongated pin elements having a second length, wherein the conductive socket retaining portions of the first set are offset along the direction of the socket axis from conductive socket retaining portions of the second set.

17. The apparatus of claim 16, wherein the conductive socket portions of the first and second set of socket elements include socket pin elements.

18. The apparatus of claim 16, wherein the conductive socket portions of the first and second set of socket elements include back to back conductive socket retaining portions open in opposing directions along the socket axis.

19. The apparatus of claim 16, wherein each of the first set of socket elements include:

an opening portion defined in the socket body member adjacent the first body member end, a conductive socket retaining portion extending from the opening to receive the elongated pin element having the first length, and a conductive pin element portion extending from the conductive socket portion extending through and beyond the second body member end; and wherein each of the second set of socket elements include:

a conductive socket retaining portion adjacent the first body member end, and a conductive pin element portion extending from the conductive socket retaining portion extending through and beyond the second body member end.

20. The apparatus of claim 19, wherein the conductive pin element portions of the socket elements of the first set and the second set extending beyond the second body member end an equal distance.

21. The apparatus of claim 19, wherein the opening portion of the socket elements of the first set are adjacent and insulated from the conductive socket retaining portions of the second set.

22. The apparatus of claim 19, wherein the conductive socket retaining portions of the socket elements of the first set are adjacent and insulated from the conductive pin element portions of the second set.

23. The apparatus of claim 16, wherein each of the first set of socket elements include:

an opening portion defined in the socket body member adjacent the first body member end, a first conductive socket retaining portion extending from the opening to receive the elongated pin element having the first length, a second conductive socket retaining portion extending from the first conductive socket retaining portion open in the opposing direction along the socket axis, and an opening portion defined adjacent the second body member end and extending to the second conductive socket retaining portion; and wherein each of the second set of socket elements include:

an opening portion defined in the socket body member adjacent the first body member end, a first conductive socket retaining portion extending from the opening to receive the elongated pin element having the second length, a second conductive socket retaining portion extending form the first conductive socket retaining portion open in the opposing direction along the socket axis, and an opening portion defined adjacent the second body member end and extending to the second conductive socket retaining portion.

24. The apparatus of claim 23, wherein the opening portions of the socket elements of the first set adjacent the first body member end are adjacent and insulated from the first and second conductive socket retaining portions of the second set.

25. The apparatus of claim 23, wherein the opening portions of the socket elements of the second set adjacent the second body member end are adjacent and insulated from the first and second conductive socket retaining portions of the first set.

26. The apparatus of claim 16, wherein the array of socket elements includes rows and columns of socket elements, wherein the rows and columns of socket elements are arranged along x and y axes perpendicular to the socket axis, and further wherein each conductive socket retaining portion is offset along the direction of the socket axis from conductive socket: retaining portions adjacent thereto along the x and y axes.

* * * * *